(12) United States Patent
Koyama

(10) Patent No.: US 7,973,694 B2
(45) Date of Patent: Jul. 5, 2011

(54) ANALOG-DIGITAL CONVERTER

(75) Inventor: Tetsuhiro Koyama, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/707,300

(22) Filed: Feb. 17, 2010

(65) Prior Publication Data

US 2010/0214147 A1    Aug. 26, 2010

(30) Foreign Application Priority Data

Feb. 24, 2009   (JP) ................................. 2009-040551

(51) Int. Cl.
*H03M 1/50*   (2006.01)
(52) U.S. Cl. ...................... 341/166; 341/155; 341/156
(58) Field of Classification Search .................. 341/155, 341/156, 166, 131, 139
See application file for complete search history.

(56) References Cited

U.S. PATENT DOCUMENTS

| | | | | |
|---|---|---|---|---|
| 3,646,586 A | * | 2/1972 | Kurz | 341/139 |
| 4,395,701 A | * | 7/1983 | Evans | 341/131 |
| 5,614,902 A | * | 3/1997 | Hopkins | 341/118 |
| 6,243,034 B1 | * | 6/2001 | Regier | 341/166 |

FOREIGN PATENT DOCUMENTS

JP   2007-139700 A   6/2007

* cited by examiner

*Primary Examiner* — Jean B Jeanglaude
(74) *Attorney, Agent, or Firm* — Sughrue Mion, PLLC

(57) ABSTRACT

An analog-digital converter according to the present invention includes an input polarity switching unit, an integrator that integrates an input signal, an integrator output adjusting circuit that adjusts an output voltage of the integrator, a window comparator, and a controller that controls the input polarity switching unit, the integrator output adjusting circuit, and the window comparator, and generates a digital signal. When the output voltage of the integrator reaches a first reference voltage, the controller resets reference voltage of a high-voltage side comparator to a second reference voltage. Further, when the output voltage of the integrator reaches a third reference voltage, the controller resets reference voltage of a low-voltage side comparator to a fourth reference voltage. According to the analog-digital converter of the present invention, it is possible to prevent device breakdown and occurrence of through current due to fluctuation of the output voltage of the integrator.

10 Claims, 3 Drawing Sheets

ANALOG-DIGITAL CONVERTER

INCORPORATION BY REFERENCE

This application is based upon and claims the benefit of priority from Japanese patent application No. 2009-040551, filed on Feb. 24, 2009, the disclosure of which is incorporated herein in its entirety by reference.

BACKGROUND

1. Field of the Invention

The present invention relates to an analog-digital converter that converts an analog signal to a digital signal.

2. Description of Related Art

In recent years, an analog-digital converter (ADC) that converts an analog signal to a digital signal has been used in various fields. FIG. 3 shows V-F (Voltage to Frequency) type of ADC disclosed in Japanese Unexamined Patent Application Publication No. 2007-139700.

As shown in FIG. 3, a voltage-pulse converter 100 includes an input switching circuit 104, an integrator output inductive unit 105 as a voltage inductive unit, an integrator 108, first and second comparators 112 and 113 (window comparator), an RS latch circuit 114, first and second integrator output error detecting circuits 116, 119, first and second comparator continuous output judgment circuits 117, 118, and a flip-flop FF 123 as a flag output unit.

Now, the input switching circuit 104 switches connection between a CS positive terminal and a CS negative terminal and a positive or negative input terminal of the integrator 108. Further, the integrator 108 includes a differential amplifier 111, a resistor 109 having one end connected with a negative terminal (inverting input terminal) of the differential amplifier 111, and a capacitor 110 connected between an output of the differential amplifier 111 and a negative terminal thereof.

The integrator output inductive unit 105 includes switches 106 and 107 having one end connected to nodes 106a and 106b, respectively, and having the other end set to a reference potential. The integrator output inductive unit 105 leads the output of the integrator 108 to around first or second detection voltage.

The first and second comparators 112 and 113 detect from the output of the integrator 108 a first detection voltage (1 V) and a second detection voltage (2 V) which is higher than the first detection voltage.

The FF 123 outputs a flag FLAG based on the comparison result in the first and second comparators 112 and 113. Further, an inverter 124 outputs an output signal CKOUT having frequency according to the input voltage.

According to such an operation, the circuit shown in FIG. 3 converts the input voltage generated between the CS positive terminal 101 and the CS negative terminal 102 to the pulse. The input switching circuit 104 switches the connection based on the flag FLAG and the output signal CKOUT.

Further, the circuit shown in FIG. 3 includes an error detecting circuit 116 that generates an integrator output error signal E-H when an output voltage of the integrator 108 is higher than high-potential side reference detection voltage (2 V) for at least a predetermined period of time. When the integrator output voltage error signal E-H is input to an OR circuit 120, the OR circuit 120 outputs a signal OUT120 to the integrator output inductive unit 105. Upon receiving the signal OUT 120, the integrator output inductive unit 105 turns on the switch 106, so as to lead the output voltage of the integrator to the potential that is lower than the high-potential side reference detection voltage (2 V).

Similarly, the circuit shown in FIG. 3 includes an error detecting circuit 119 that generates an integrator output error signal E-L when the output voltage of the integrator 108 is lower than low-potential side reference detection voltage (1 V) for at least a predetermined period of time. When the integrator output voltage error signal E-L is input to an OR circuit 122, the OR circuit 122 outputs a signal OUT122 to the integrator output inductive unit 105. Upon receiving the signal OUT122, the integrator output inductive unit 105 turns on the switch 107, so as to lead the output voltage of the integrator to the potential that is higher than the low-potential side reference detection voltage (1 V).

SUMMARY

However, the present inventors have found a problem in the analog-digital converter shown in FIG. 3 that, when the output voltage of the integrator 108 exceeds device breakdown, the device may be broken down.

Another problem is that, when the output voltage of the integrator 108 is smaller than the ground potential (mainly 0 V in case of CMOS), through current may flow in the circuit.

Further, in the circuit shown in FIG. 3, the error is detected when a predetermined period has passed after the output voltage of the integrator 108 is higher than the high-potential side reference detection voltage or lower than the low-potential side reference detection voltage. However, in this case, a circuit or a program is required to detect that the predetermined period has passed after exceeding the reference voltage level, which increases circuit size.

An exemplary aspect of the invention is an analog-digital converter including an input polarity switching unit that switches polarity of an input signal, an integrator that integrates the input signal output from the input polarity switching unit, an integrator output adjusting circuit that adjusts an output voltage of the integrator, a window comparator that includes a high-voltage side comparator and a low-voltage side comparator, the high-voltage side comparator including a first reference voltage and a second reference voltage that is higher than the first reference voltage, the low-voltage side comparator including a third reference voltage and a fourth reference voltage that is lower than the third reference voltage, the window comparator further comparing the output voltage of the integrator with the first to fourth reference voltages, and a controller that controls the input polarity switching unit, the integrator output adjusting circuit, and the window comparator based on the comparison result in the window comparator, and generates a digital signal. The controller resets the reference voltage of the high-voltage side comparator to the second reference voltage when the output voltage of the integrator reaches the first reference voltage, and resets the reference voltage of the low-voltage side comparator to the fourth reference voltage when the output voltage of the integrator reaches the third reference voltage. Further, the integrator output adjusting circuit adjusts the output voltage of the integrator so that the output voltage of the integrator becomes lower than the second reference voltage when the output voltage of the integrator reaches the second reference voltage, and adjusts the output voltage of the integrator so that the output voltage of the integrator becomes higher than the fourth reference voltage when the output voltage of the integrator reaches the fourth reference voltage.

In the analog-digital converter having the above configuration, when the output voltage of the integrator reaches the first reference voltage, the reference voltage of the high-potential side comparator is reset to the second reference voltage. Further, when the output voltage of the integrator reaches the second reference voltage, the integrator output adjusting circuit adjusts the output voltage of the integrator so that the output voltage of the integrator becomes lower than the second reference voltage. Accordingly, it is possible to prevent device breakdown due to increase of the output voltage of the integrator.

Further, in the analog-digital converter having the above configuration, when the output voltage of the integrator reaches the third reference voltage, the reference voltage of the low-potential side comparator is reset to the fourth reference voltage. Further, when the output voltage of the integrator reaches the fourth reference voltage, the integrator output adjusting circuit adjusts the output voltage of the integrator so that the output voltage of the integrator becomes higher than the fourth reference voltage. Accordingly, it is possible to prevent occurrence of through current due to decrease of the output voltage of the integrator.

According to the present invention, it is possible to prevent device breakdown and occurrence of through current due to fluctuation of the output voltage of the integrator.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
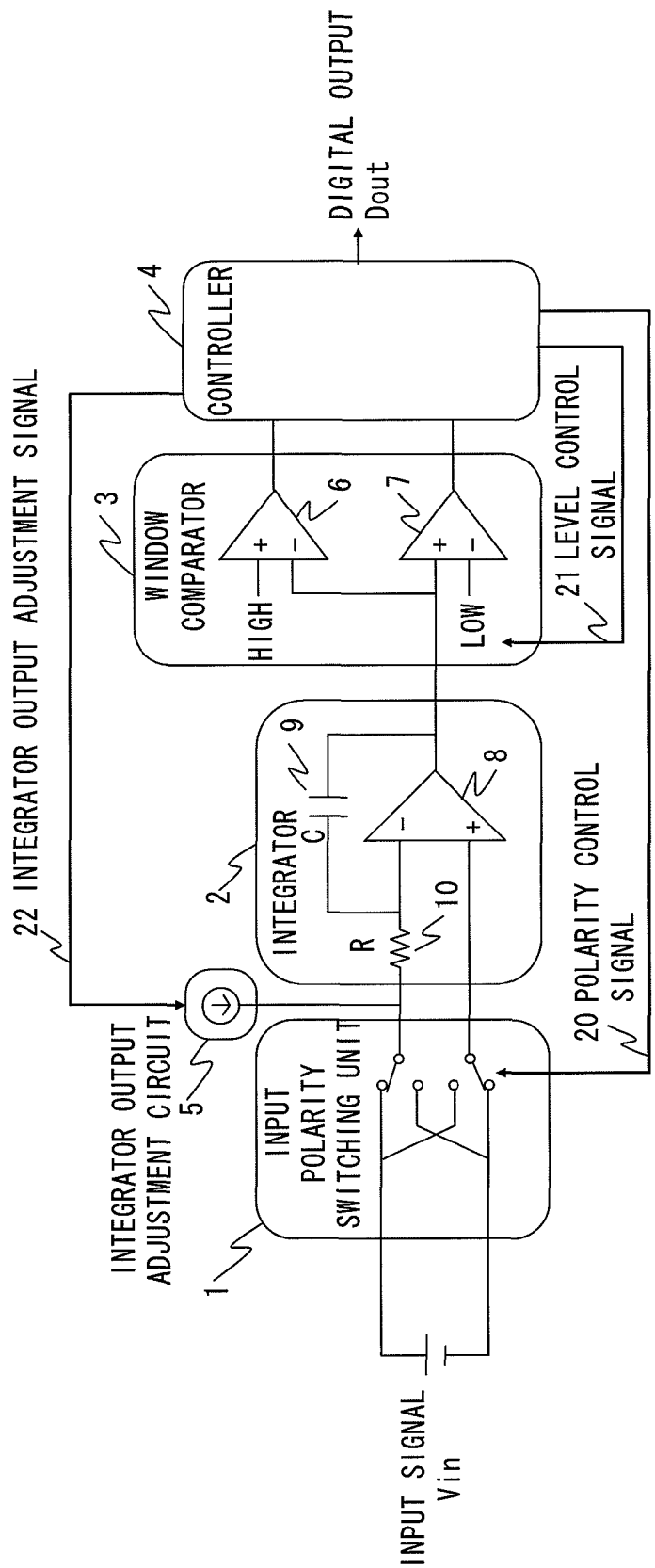
FIG. 1 shows an analog-digital converter according to an exemplary embodiment of the present invention.

Hereinafter, the exemplary embodiment of the present invention will be described with reference to the drawings. FIG. 1 shows an analog-digital converter according to the exemplary embodiment of the present invention. In FIG. 1, the analog-digital converter includes an input polarity switching unit 1 that switches the polarity of an input signal, an integrator 2 that integrates the input signal output from the input polarity switching unit 1, and an integrator output adjusting circuit 5 that adjusts the output voltage of the integrator 2.

The analog-digital converter further includes a high-voltage side comparator 6 that includes a first reference voltage and a second reference voltage that is higher than the first reference voltage, a low-voltage side comparator 7 that includes a third reference voltage and a fourth reference voltage that is lower than the third reference voltage, and a window comparator that compares the output voltage of the integrator 2 with the first to fourth reference voltages. The analog-digital converter further includes a controller 4 that controls the input polarity switching unit 1, the integrator output adjusting circuit 5, and the window comparator 3 based on the comparison result of the window comparator 3 and generates a digital signal.

The controller 4 resets the reference voltage of the high-voltage side comparator 6 to the second reference voltage when the output voltage of the integrator 2 reaches the first reference voltage. Further, the controller 4 resets the reference voltage of the low-voltage side comparator 7 to the fourth reference voltage when the output voltage of the integrator 2 reaches the third reference voltage.

Further, the integrator output adjusting circuit 5 adjusts the output voltage of the integrator 2 so that the output voltage of the integrator 2 is lower than the second reference voltage when the output voltage of the integrator 2 reaches the second reference voltage. Further, the integrator output adjusting circuit 5 adjusts the output voltage of the integrator 2 so that the output voltage of the integrator 2 is higher than the fourth reference voltage when the output voltage of the integrator 2 reaches the fourth reference voltage. Hereinafter, the analog-digital converter according to the exemplary embodiment will be described in detail.

The input polarity switching unit 1 receives an input signal Vin and outputs the input signal to the integrator 2. At this time, the input polarity switching unit 1 switches the polarity of the input signal Vin based on a polarity control signal 20 output from the controller 4. More specifically, the input polarity switching unit 1 switches two states of (1) connecting a plus-side terminal to which an input signal is applied and a negative terminal (inverting input terminal) of a differential amplifier and connecting a minus-side terminal to which an input signal is applied and a positive terminal (non-inverting input terminal) of a differential amplifier, and (2) connecting a plus-side terminal to which an input signal is applied and a positive terminal (non-inverting input terminal) of a differential amplifier and connecting a minus-side terminal to which an input signal is applied and a negative terminal (inverting input terminal) of a differential amplifier based on the polarity control signal 20 from the controller 4. As such, the output voltage of the integrator 2 may be changed from the negative slope to the positive slope, or from the positive slope to the negative slope.

The integrator 2 includes a differential amplifier 8, a resistor 10 having one terminal connected to a negative terminal (inverting input terminal) of the differential amplifier 8, and a capacitor 9 that is connected between the output of the differential amplifier 8 and the negative terminal. The other end of the resistor 10 and the positive terminal (non-inverting input terminal) of the differential amplifier 8 are connected to the plus-side terminal and the minus-side terminal by the input polarity switching unit 1.

The window comparator 3 includes a high-voltage side comparator 6 and a low-voltage side comparator 7. The high-voltage side comparator 6 has a positive terminal which is a high-voltage side reference voltage, and the negative terminal thereof and the output of the integrator 2 are connected together. The reference voltage of the high-voltage side comparator 6 includes a first reference voltage and a second reference voltage that is higher than the first reference voltage. The first reference voltage is set to the voltage within a range of the normal operation of the integrator 2, for example. On the other hand, the second reference voltage is set to the voltage such that the device is broken down when the output voltage of the integrator 2 becomes somewhat higher than the second reference voltage, for example. However, the first and second reference voltages may be set arbitrarily according to its purpose.

The comparator 6 outputs the result of comparing the output voltage of the integrator 2 with the first and second reference voltages to the controller 4. Further, the first reference voltage and the second reference voltage are set based on a level control signal 21 from the controller 4.

Further, the low-voltage side comparator 7 has a negative terminal which is a low-voltage side reference voltage, and a positive terminal thereof and the output of the integrator 2 are connected. The reference voltage of the low-voltage side comparator 7 includes a third reference voltage and a fourth reference voltage which is lower than the third reference voltage. The third reference voltage is set to the voltage within a range of the normal operation of the integrator 2, for example. On the other hand, the fourth reference voltage is set to the voltage so that through current is generated in the circuit when the output voltage of the integrator 2 becomes somewhat lower than the fourth reference voltage. However, the above third and fourth reference voltages can be set arbitrarily according to its purpose.

The comparator 7 outputs the result of comparing the output voltage of the integrator 8 with the third and fourth reference voltages to the controller 4. Further, the third reference voltage and the fourth reference voltage are set based on the level control signal 21 from the controller 4.

The controller 4 generates signals to control the input polarity switching unit 1, the integrator output adjusting circuit 5, and the window comparator 3 based on the comparison result in the window comparator 3, which are outputs of the comparators 6 and 7. In short, the controller 4 generates the polarity control signal 20 which is the signal to control the input polarity switching unit 1. Further, the controller 4 generates the level control signal 21 which is the signal to set the first to fourth reference voltages of the comparators 6 and 7. Further, the controller 4 generates an integrator output adjustment signal 22 which is a signal to instruct the integrator output adjusting circuit 5 to adjust the output voltage of the integrator 2.

The controller 4 generates the signal to reset the reference voltage of the high-voltage side comparator 6 to the second reference voltage as the level control signal 21 when the output voltage of the integrator 2 reaches the first reference voltage. Further, the controller 4 generates the signal to reset the reference voltage of the low-voltage side comparator 7 to the fourth reference voltage as the level control signal 21 when the output voltage of the integrator 2 reaches the third reference voltage.

Further, the controller 4 generates the digital signal based on the comparison result in the window comparator 3, which are the outputs of the comparators 6 and 7, so as to output a digital output Dout.

The integrator output adjusting circuit 5 is provided between the input polarity switching unit 1 and the integrator 2, and adjusts the output voltage of the integrator 2 based on the integrator output adjustment signal 22 from the controller 4. More specifically, when the output voltage of the integrator 2 reaches the second reference voltage, the integrator output adjusting circuit 5 adjusts the output voltage of the integrator 2 so that the output of the integrator 2 becomes lower than the second reference voltage. Further, when the output voltage of the integrator 2 reaches the fourth reference voltage, the integrator output adjusting circuit 5 adjusts the output voltage of the integrator 2 so that the output of the integrator 2 becomes higher than the fourth reference voltage.

Figure 2:
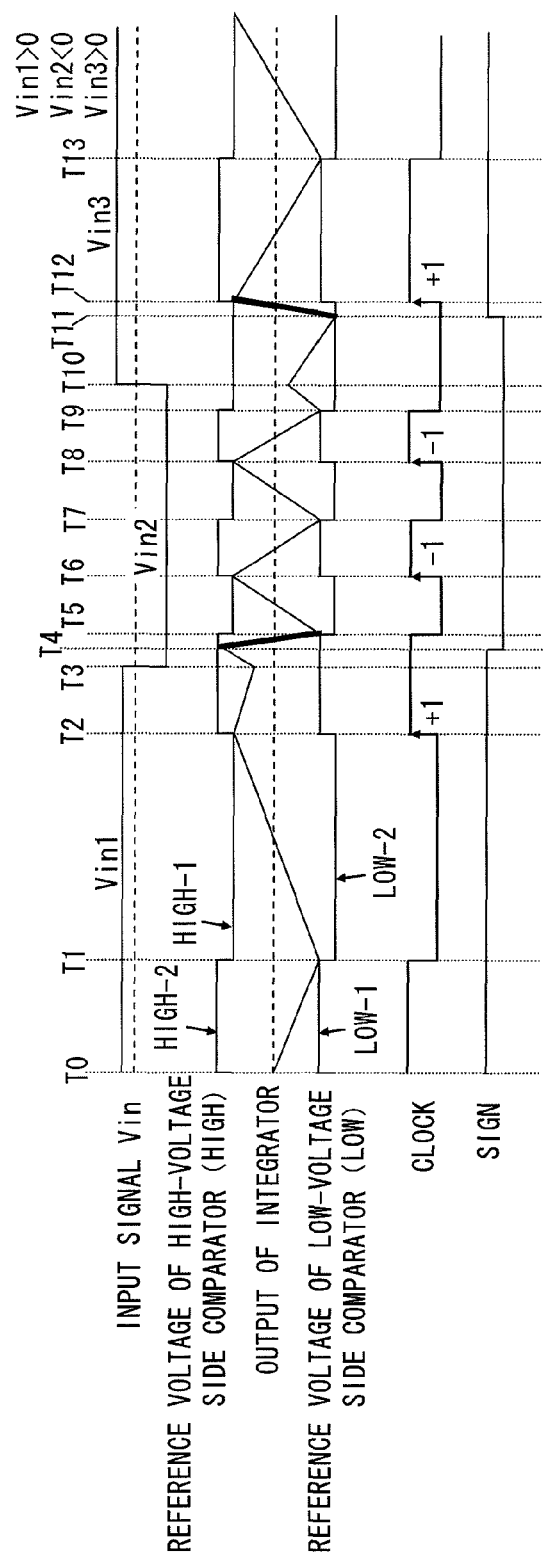
FIG. 2 shows an example of operational waveforms of the analog-digital converter according to the exemplary embodiment of the present invention.
Figure 3:
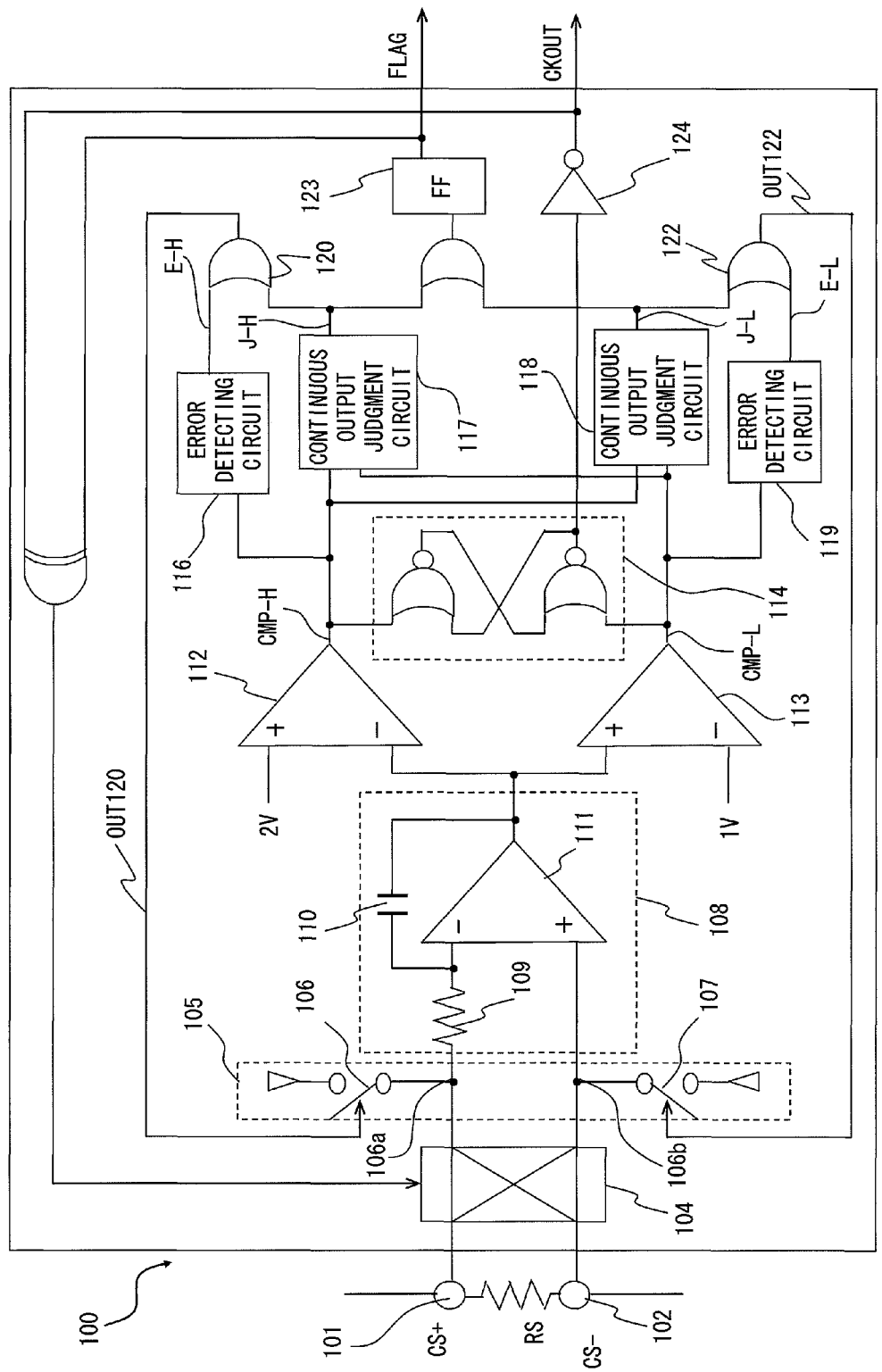
FIG. 3 is a diagram for describing an analog-digital converter according to Japanese Unexamined Patent Application Publication No. 2007-139700.

Referring next to FIG. 2, the operation of the analog-digital converter will be described using operational waveforms of the analog-digital converter according to the exemplary embodiment.

In FIG. 2, the input signal Vin is Vin1 from T0 to T3, Vin2 from T3 to T10, and Vin3 after T10. Now, Vin1, Vin2, and Vin3 satisfy Vin1>0, Vin2<0, and Vin3>0, respectively. Further, when absolute values of Vin1, Vin2, and Vin3 are compared, |Vin1|<|Vin3|<|Vin2| is satisfied.

The reference voltage of the high-voltage side comparator has two values of first reference voltage (High-1) and second reference voltage (High-2), as shown in FIG. 2. Further, the reference voltage of the low-voltage side comparator has two values of third reference voltage (Low-1) and fourth reference voltage (Low-2), as shown in FIG. 2. The reference voltages of the high-voltage side comparator and the reference voltages of the low-voltage side comparator are switched at the following timing.

For example, when the output voltage of the integrator 2 reaches the third reference voltage (Low-1) of the low-voltage side comparator such as at the timing of T1 shown in FIG. 2, the reference voltage of the low-voltage side comparator is switched from the third reference voltage (Low-1) to the fourth reference voltage (Low-2). Further, the high-voltage side second reference voltage (High-2) is switched to the first reference voltage (High-1) at this timing.

Further, when the output voltage of the integrator 2 reaches the first reference voltage (High-1) of the high-voltage side comparator such as at the timing of T2 shown in FIG. 2, the reference voltage of the high-voltage side comparator is switched from the first reference voltage (High-1) to the second reference voltage (High-2). Further, the low-voltage side fourth reference voltage (Low-2) is switched to the third reference voltage (Low-1).

As described above, the reference voltages of the comparators 6 and 7 are switched at a timing at which the output voltage of the integrator 2 reaches the first reference voltage (High-1) of the high-voltage side comparator or the third reference voltage (Low-1) of the low-voltage side comparator.

The clock is inverted when the output voltage of the integrator 2 reaches the reference voltage High-1 of the high-voltage side comparator 6 or the reference voltage Low-1 of the low-voltage side comparator 7. This clock is generated in the controller 4.

The sign is inverted when the output voltage of the integrator 2 reaches the reference voltage High-2 of the high-voltage side comparator 6 or the reference voltage Low-2 of the low-voltage side comparator 7.

Further, the counter embedded in the controller 4 counts +1 when the sign is plus at a timing at which the clock signal is raised, and −1 when the sign is minus. The digital output Dout outputs the signal based on the output of this counter.

Next, the operation from T0 to T13 of the operational waveforms of the analog-digital converter according to the exemplary embodiment shown in FIG. 2 will be described.

First, from T0 to T1, Vin1 is input to the integrator 2 as the input signal Vin. At this time, the output voltage of the integrator shows a downward-sloping curve, and reaches Low-1 at a timing of T1. At this timing, the controller 4 switches the reference voltage of the high-voltage side comparator from High-2 to High-1. Further, the controller 4 switches the reference voltage of the low-voltage side comparator from Low-1 to Low-2. At this time, the clock signal is switched (fallen) from High to Low. Further, the controller 4 outputs the polarity control signal 20 that switches the polarity of the input signal Vin at a timing of T1 to the input polarity switching unit 1.

Next, the operation from T1 to T2 will be described. Also from T1 to T2, the input signal Vin is Vin1. However, as the input polarity is switched at a timing of T1, the output voltage of the integrator shows an upward-sloping curve. Then, at a timing of T2, the output voltage reaches High-1. At this timing, the controller 4 switches the reference voltage of the high-voltage side comparator from High-1 to High-2, and switches the reference voltage of the low-voltage side comparator from Low-2 to Low-1. At this time, the clock signal is switched (raised) from Low to High. Then, as the sign of the counter is plus, +1 is counted at a timing at which the clock signal is raised. Further, the controller 4 outputs the polarity control signal 20 that switches the polarity of the input signal Vin at a timing of T2 to the input polarity switching unit 1.

Next, the operation from T2 to T5 will be described. As the input polarity of the input signal Vin1 is switched at a timing of T2, the output voltage of the integrator shows a downward-sloping curve. Then, the input signal Vin is changed from Vin1 to Vin2 at a timing of T3. At this time, as Vin2<0 (inverse polarity to Vin1) is satisfied, the slope of the output voltage of the integrator shows an upward-sloping curve. Further, as the absolute value of Vin2 is larger than the absolute value of Vin1, the slope of the output voltage of the integrator becomes steeper compared with a case of Vin1 when the input signal is Vin2.

Then, the output voltage of the integrator reaches High-2 at a timing of T4. At this timing, the controller 4 outputs the integrator output adjustment signal 22 to the integrator output adjusting circuit 5 to adjust the level of the input signal so that the output voltage of the integrator becomes smaller than High-2. More specifically, the integrator output adjusting circuit 5 stores charge in the capacitor 9 of the integrator 2. As the charge is stored in the capacitor 9, the output voltage of the differential amplifier 8 is reduced. Thus, the output voltage of the integrator 2 is led to around Low-1. Further, as the output voltage of the integrator reaches High-2 at a timing of T4, the controller 4 inverts the sign from plus to minus.

Then, the output voltage of the integrator reaches Low-1 at a timing of T5. At this timing, the controller 4 switches the reference voltage of the high-voltage side comparator from High-2 to High-1, and switches the reference voltage of the low-voltage side comparator from Low-1 to Low-2. At this time, the clock signal is switched from High to Low. Note that, when the output voltage of the integrator reaches Low-1 by adjustment of the integrator output adjusting circuit 5, the input polarity switching unit 1 does not switch the polarity of the input signal. In summary, the input polarity from T5 to T6 is equal to the input polarity from T3 to T4 before adjustment by the integrator output adjusting circuit 5.

Next, the operation from T5 to T9 will be described. Also from T5 to T9, the input signal Vin is Vin2. At a timing of T5, the input polarity is not switched, and the output voltage of the integrator from T5 to T6 shows an upward-sloping curve. Then, the output voltage reaches High-1 at a timing of T6. At this timing, the controller 4 switches the reference voltage of the high-voltage side comparator from High-1 to High-2, and switches the reference voltage of the low-voltage side comparator from Low-2 to Low-1. At this time, the clock signal is switched from Low to High. As the sign is minus, the counter counts −1 at a timing at which the clock signal is raised. Further, the controller 4 outputs the polarity control signal 20 that switches the polarity of the input signal Vin at a timing T6 to the input polarity switching unit 1.

As the input polarity of the input signal Vin2 is switched at a timing of T6, the output voltage of the integrator from T6 to T7 shows a downward-sloping curve. Then, the output voltage reaches Low-1 at a timing of T7. At this timing, the controller 4 switches the reference voltage of the high-voltage side comparator from High-2 to High-1, and switches the reference voltage of the low-voltage side comparator from Low-1 to Low-2. At this time, the clock signal is switched from High to Low. Further, the controller 4 outputs the polarity control signal 20 that switches the polarity of the input signal Vin at a timing of T7 to the input polarity switching unit 1.

Also from T7 to T9, the operation similar to that from T5 to T7 is performed.

Next, the operation from T9 to T13 will be described. As the input polarity of the input signal Vin2 is switched at a timing of T9, the output voltage of the integrator from T9 to T10 shows an upward-sloping curve. Then, the input signal Vin is changed from Vin2 to Vin3 at a timing of T10. At this time, as Vin3>0 (inverse polarity to Vin2) is satisfied, the slope of the output voltage of the integrator shows a downward-sloping curve. Further, as the absolute value of Vin3 is smaller than that of Vin2, the slope of the output voltage of the integrator is slighter compared with a case of Vin2 when the input signal is Vin3.

Then, the output voltage of the integrator reaches Low-2 at a timing of T11. At this timing, the controller 4 outputs the integrator output adjustment signal 22 to the integrator output adjusting circuit 5 to adjust the level of the input signal Vin3 so that the output voltage of the integrator becomes larger than Low-2. More specifically, the integrator output adjusting circuit 5 discharges the charge stored in the capacitor 9 of the integrator. As the charge stored in the capacitor 9 is discharged, the output voltage of the differential amplifier is raised. Thus, the output voltage of the integrator is led to around High-1. Further, as the output voltage of the integrator reaches Low-2 at a timing of T11, the control circuit inverts the sign from minus to plus.

Then, the output voltage of the integrator reaches High-1 at a timing of T12. At this timing, the controller 4 switches the reference voltage of the high-voltage side comparator from High-1 to High-2, and switches the reference voltage of the low-voltage side comparator from Low-2 to Low-1. At this time, the clock signal is switched from Low to High. As the sign is plus, the counter counts +1 at a timing at which the clock signal is raised. Note that the input polarity switching unit 1 does not switch the polarity of the input signal when the output voltage of the integrator reaches High-1 by adjustment by the integrator output adjusting circuit 5. In summary, the input polarity from T12 to T13 becomes equal to the input polarity from T10 to T11 before adjustment by the integrator output adjusting circuit 5.

As the input polarity is not switched at a timing of T12, the output voltage of the integrator from T12 to T13 shows a downward-sloping curve. Then, the output voltage reaches Low-1 at a timing of T13. At this timing, the controller 4 switches the reference voltage of the high-voltage side comparator from High-2 to High-1, and switches the reference voltage of the low-voltage side comparator from Low-1 to Low-2. At this time, the clock signal is switched from High to Low. Further, the controller 4 outputs the polarity control signal 20 that switches the polarity of the input signal Vin at a timing of T13 to the input polarity switching unit 1.

As described above, in the analog-digital converter according to the exemplary embodiment of the present invention, when the output voltage of the integrator 2 reaches the first reference voltage (High-1), the reference voltage of the high-potential side comparator 6 is reset to the second reference voltage (High-2). Further, when the output voltage of the integrator 2 reaches the second reference voltage (High-2), the integrator output adjusting circuit 5 adjusts the output voltage of the integrator 2 so that the output voltage of the integrator 2 becomes lower than the second reference voltage (High-2). Accordingly, it is possible to prevent device breakdown due to the increase of the output voltage of the integrator 2.

Further, in the analog-digital converter according to the exemplary embodiment of the present invention, when the output voltage of the integrator 2 reaches the third reference voltage (Low-1), the reference voltage of the low-potential side comparator 7 is reset to the fourth reference voltage (Low-2). Further, when the output voltage of the integrator 2 reaches the fourth reference voltage (Low-2), the integrator output adjusting circuit 5 adjusts the output voltage of the integrator 2 so that the output voltage of the integrator 2 becomes higher than the fourth reference voltage (Low-2). Accordingly, it is possible to prevent occurrence of through current due to the decrease of the output voltage of the integrator 2.

According to the exemplary embodiment of the present invention, it is possible to provide an analog-digital converter that is able to prevent device breakdown and the occurrence of the through current due to the fluctuation of the output voltage of the integrator.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An analog-digital converter comprising:
   an input polarity switching unit that switches polarity of an input signal;
   an integrator that integrates the input signal output from the input polarity switching unit;
   an integrator output adjusting circuit that adjusts an output voltage of the integrator;
   a window comparator that includes a high-voltage side comparator and a low-voltage side comparator, the high-voltage side comparator including a first reference voltage and a second reference voltage that is higher than the first reference voltage, the low-voltage side comparator including a third reference voltage and a fourth reference voltage that is lower than the third reference voltage, the window comparator further comparing the output voltage of the integrator with the first to fourth reference voltages; and
   a controller that controls the input polarity switching unit, the integrator output adjusting circuit, and the window comparator based on the comparison result in the window comparator, and generates a digital signal, wherein
   the controller resets the first reference voltage of the high-voltage side comparator to the second reference voltage when the output voltage of the integrator reaches the first reference voltage, and resets the third reference voltage of the low-voltage side comparator to the fourth reference voltage when the output voltage of the integrator reaches the third reference voltage, and
   the integrator output adjusting circuit adjusts the output voltage of the integrator so that the output voltage of the integrator becomes lower than the second reference voltage when the output voltage of the integrator reaches the second reference voltage, and adjusts the output voltage of the integrator so that the output voltage of the integrator becomes higher than the fourth reference voltage when the output voltage of the integrator reaches the fourth reference voltage.

2. The analog-digital converter according to claim 1, wherein the integrator output adjusting circuit stores charge in a capacitor that forms the integrator and reduces the output voltage of the integrator when the output voltage of the integrator reaches the second reference voltage.

3. The analog-digital converter according to claim 1, wherein the integrator output adjusting circuit removes charge from a capacitor that forms the integrator and increases the output voltage of the integrator when the output voltage of the integrator reaches the fourth reference voltage.

4. The analog-digital converter according to claim 1, wherein the input polarity switching unit switches polarity of the input signal input to the integrator when the output voltage of the integrator reaches the first reference voltage or the third reference voltage at a timing other than a timing immediately after adjustment of the integrator output adjusting circuit.

5. The analog-digital converter according to claim 4, wherein the input polarity switching unit switches polarity of the input signal so that an input signal of positive polarity is input to an inverting input terminal of a differential amplifier that forms the integrator when the output voltage of the integrator reaches the first reference voltage.

6. The analog-digital converter according to claim 4, wherein the input polarity switching unit switches polarity of the input signal so that an input signal of negative polarity is input to an inverting input terminal of a differential amplifier that forms the integrator when the output voltage of the integrator reaches the third reference voltage.

7. The analog-digital converter according to claim 1, wherein the controller resets the first reference voltage of the high-voltage side comparator to the second reference voltage, and resets the fourth reference voltage of the low-voltage side comparator to the third reference voltage when the output voltage of the integrator reaches the first reference voltage.

8. The analog-digital converter according to claim 1, wherein the controller resets the third reference voltage of the low-voltage side comparator to the fourth reference voltage, and resets the second reference voltage of the high-voltage side comparator to the first reference voltage when the output voltage of the integrator reaches the third reference voltage.

9. The analog-digital converter according to claim 1, wherein the controller inverts a clock signal when the output voltage of the integrator reaches the first reference voltage or the third reference voltage, and inverts a sign when the output voltage of the integrator reaches the second reference voltage or the fourth reference voltage, so as to generate a count value based on the clock signal and the sign.

10. The analog-digital converter according to claim 9, wherein the controller counts +1 at a timing at which the clock signal is raised when the sign is plus, and counts −1 at a timing at which the clock signal is raised when the sign is minus.

* * * * *